(12) United States Patent
Zhang et al.

(10) Patent No.: US 7,230,413 B2
(45) Date of Patent: Jun. 12, 2007

(54) FLEXIBLE CURRENT SENSOR

(75) Inventors: Bin Zhang, Alpharetta, GA (US); Mario Bilac, Lawrenceville, GA (US)

(73) Assignee: Siemens Energy & Automation, Inc., Alpharetta, GA (US)

( * ) Notice: Subject to any disclaimer, the term of this patent is extended or adjusted under 35 U.S.C. 154(b) by 0 days.

(21) Appl. No.: 10/968,463

(22) Filed: Oct. 19, 2004

(65) Prior Publication Data
US 2006/0082356 A1   Apr. 20, 2006

(51) Int. Cl.
*G01R 15/18* (2006.01)
(52) U.S. Cl. .................. 324/117 R; 324/127
(58) Field of Classification Search ............... 324/127, 324/117.11, 117.12, 207.2, 251, 96
See application file for complete search history.

(56) References Cited

U.S. PATENT DOCUMENTS

| | | | |
|---|---|---|---|
| 3,434,052 A | | 3/1969 | Fechant |
| 3,882,387 A | * | 5/1975 | Vikstrom ................ 324/117 R |
| 4,183,119 A | | 1/1980 | Stewart et al. |
| 4,348,638 A | | 9/1982 | Boldridge, Jr. ............. 324/127 |
| 4,658,478 A | | 4/1987 | Paradis |
| 4,829,298 A | | 5/1989 | Fernandes |
| 4,933,630 A | | 6/1990 | Dupraz |
| 5,015,945 A | | 5/1991 | Radun |
| 5,414,400 A | | 5/1995 | Gris et al. |
| 5,461,309 A | | 10/1995 | Baudart |
| 5,530,364 A | * | 6/1996 | Mashikian et al. ......... 324/529 |
| 5,594,332 A | * | 1/1997 | Harman et al. ............. 324/127 |
| 5,982,265 A | | 11/1999 | Von Skarczinski et al. |
| 6,058,354 A | | 5/2000 | Adame et al. |
| 6,064,191 A | | 5/2000 | Turner |
| 6,094,044 A | | 7/2000 | Kustera et al. |
| 6,102,347 A | | 8/2000 | Benoit |
| 6,186,451 B1 | | 2/2001 | Benoit |
| 6,295,190 B1 | | 9/2001 | Rinaldi et al. |
| 6,313,623 B1 | | 11/2001 | Kojovic et al. |

(Continued)

FOREIGN PATENT DOCUMENTS

GB       2088568       6/1982

(Continued)

OTHER PUBLICATIONS

PCT International Search Report, mailed Feb. 10, 2006.

(Continued)

*Primary Examiner*—Paresh Patel
(74) *Attorney, Agent, or Firm*—José R. de la Rosa

(57) ABSTRACT

A method and a current sensor for measuring a current in a conductor. The sensor comprises a non-magnetic, flexible core member having a first end and a second end. A locking head having a channel therethrough is coupled to the first end of the core member. A first sensor conductor winding layer is mounted on the core member. Wherein the second end releasably engages the locking thread in the channel and adjustably configures the core member to surround the conductor as the second end is moved through the channel. In another embodiment the current sensor includes a locking tang within the channel and a plurality of sought tooth members on a portion of the core member and configured to selectively engage the locking tang as the second end of the core member is moved through the channel.

14 Claims, 5 Drawing Sheets

U.S. PATENT DOCUMENTS

| | | |
|---|---|---|
| 6,366,076 B1 | 4/2002 | Karrer et al. |
| 6,392,401 B1 | 5/2002 | Cooke |
| 6,400,130 B2 | 6/2002 | Berkcan et al. |
| 6,414,474 B1 * | 7/2002 | Gohara et al. .......... 324/117 H |
| 6,437,555 B1 | 8/2002 | Pioch et al. |
| 6,563,296 B2 | 5/2003 | Cooke |
| 6,566,855 B1 | 5/2003 | Nguyen et al. |
| 6,614,218 B1 | 9/2003 | Ray |
| 6,617,858 B1 | 9/2003 | Baumgaertl et al. |
| 6,624,624 B1 | 9/2003 | Karrer et al. |
| 6,674,278 B1 | 1/2004 | Uesugi |
| 6,768,310 B2 | 7/2004 | Yugo et al. |
| 6,769,166 B1 | 8/2004 | Blanchard |
| 2004/0201373 A1 | 10/2004 | Kato .......................... 324/117 |

FOREIGN PATENT DOCUMENTS

| | | |
|---|---|---|
| JP | 2002-181850 | 6/2002 |

OTHER PUBLICATIONS

Patent Cooperation Treaty (Written Opinion of the International Searching Authority), Oct. 19, 2004.

\* cited by examiner

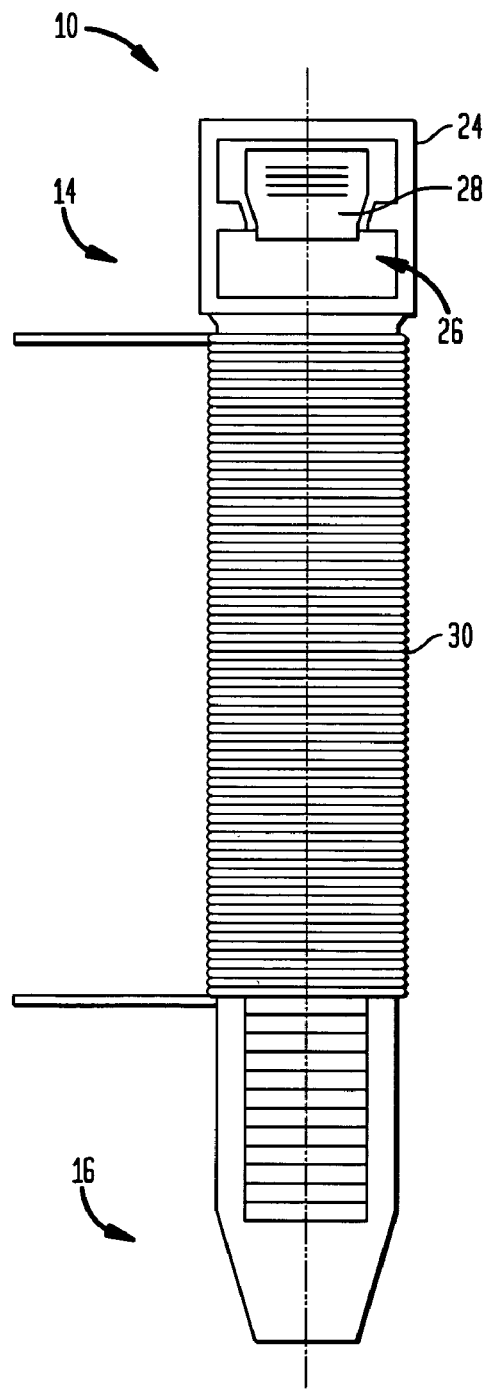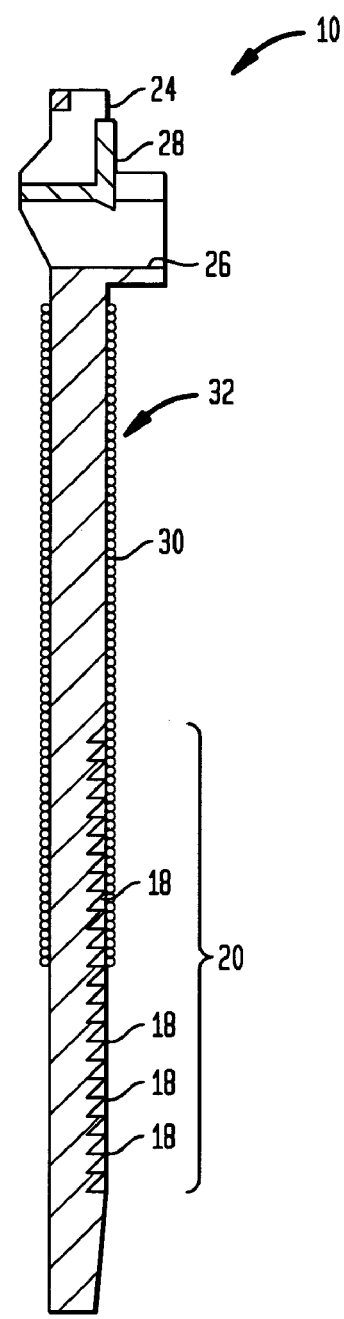

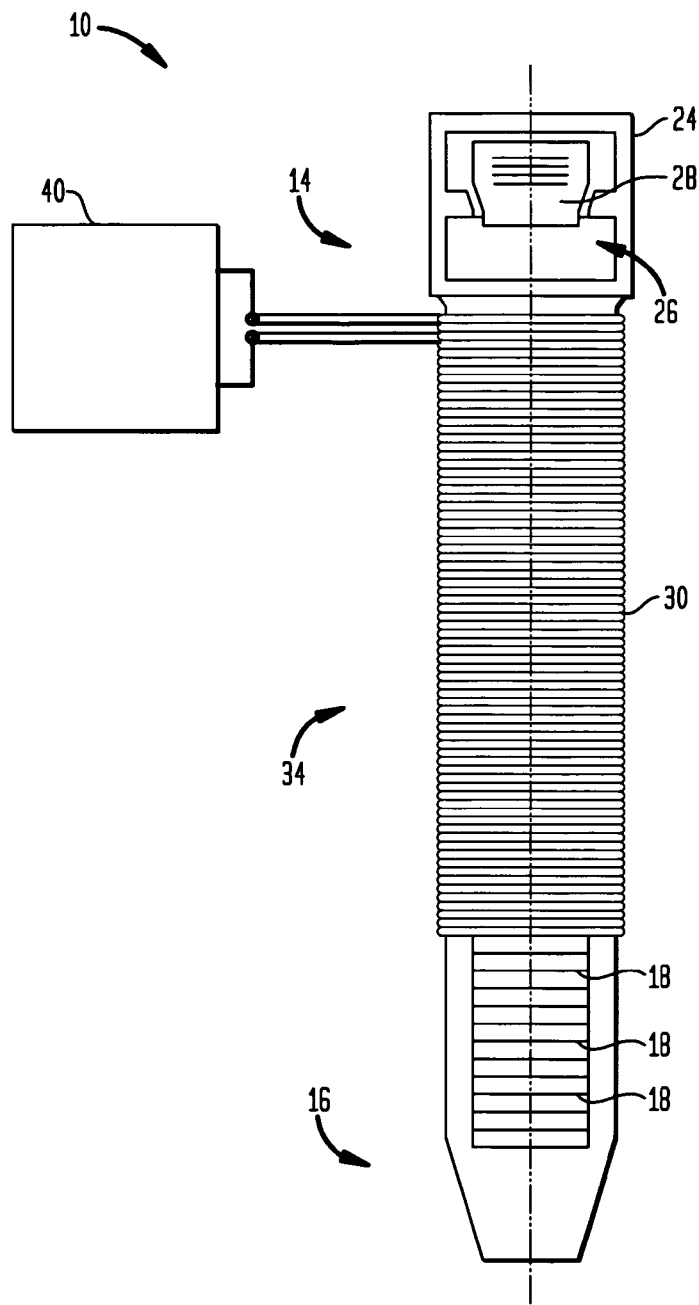
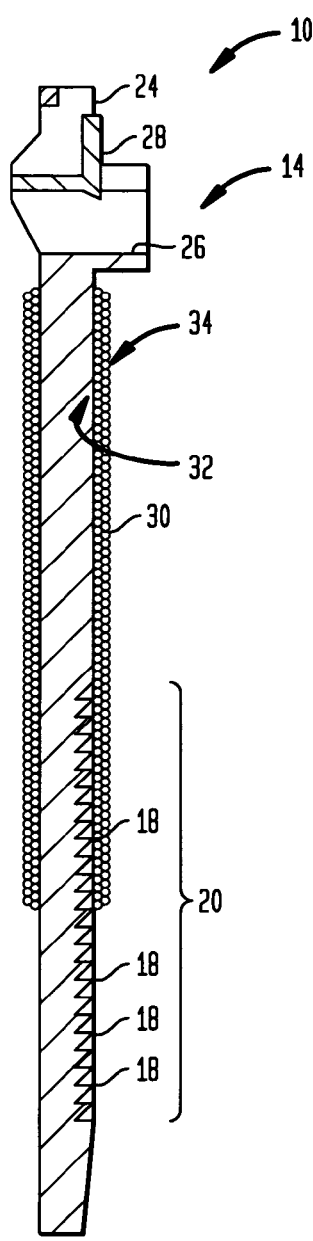
FIG. 3
FIG. 4

FLEXIBLE CURRENT SENSOR

BACKGROUND OF THE INVENTION

The present invention relates to a sensor for measuring current in an electrical conductor, more particularly for a flexible current sensor.

It is known to measure electric current in a conductor by measuring the generated field with a coil positioned around or in close proximity to the conductor being monitored. Such coils are known as a Rogowski Coil. The magnetic field caused by the current flowing in the monitored conductor induces a voltage between the ends of the coil sensor conductor in proportion to the current flowing in the monitored conductor. The induced voltage, or output signal of the Rogowski Coil is read by a signal processing circuit for further processing, such as for example, a microprocessor or voltage divider circuit.

A typical current sensor coil is either a fixed annular closed loop or an unadjustable openable loop structure. The monitor conductor is threaded through the current sensor coil. Conventional current sensors are difficult to use with different size or shaped conductors. Use of a closed loop sensor requires a disconnected, monitored conductor, so that the monitored conductor can be threaded through the loop.

Thus there is a need for a flexible current sensor operating in accordance with the Rogowski principle. There is a further need for a current sensor that can be used and reused with different sized and shaped conductors to monitor such current flow in such conductors. There is an additional need for a current sensor that can vary the diameter of a loop formed with the current sensor. There is also a need for an apparatus to make a flexible current sensor.

SUMMARY OF THE INVENTION

There is provided a current sensor for measuring a current in a conductor. The sensor comprises a non-magnetic, flexible core member having a first end and a second end. A locking head having a channel therethrough is coupled to the first end of the core member. A first sensor conductor winding layer is mounted on the core member. Wherein the second end releasably engages the locking thread in the channel and adjustably configures the core member to surround the conductor as the second end is moved through the channel. In another embodiment the current sensor includes a locking tang within the channel and a plurality of sought tooth members on a portion of the core member and configured to selectively engage the locking tang as the second end of the core member is moved through the channel.

There is also provided a method to sense electrical current in a conductor using a flexible current sensor operating in accordance with the Rogowski principle. The current sensor is an elongated, flexible strip material having a first end and a second end, a sensor conductor winding layer mounted on the flexible strip, and a locking head having a channel therethrough coupled to one end of the flexible strip. The method comprises the steps of placing the flexible current sensor on the conductor in a perpendicular aspect to the longitudinal length of the conductor. Wrapping the second end of the flexible conductor sensor around the conductor. Inserting the second end into the channel. Pulling the second end through the channel to draw the flexible current sensor against the conductor. Sensing an induced voltage in the sensor conductor representative of the electrical current flowing in the conductor.

There is further provided a method for making a flexible current sensor on an apparatus including a first fixture, a second fixture and a sensor conductor supplier. The method comprises the steps of providing a non-magnetic, flexible core member having a first end and a second end. Coupling the first end to the first fixture. Coupling the second end to the second fixture. Applying a force to the second fixture coupled to the second end to maintain the core member in a straight aspect. Coupling the sensor conductor to the core member. Rotating the first and second fixture and the core member at a fixed predetermined speed. Rotating the sensor conductor supplier at a predetermined speed and moving the sensor conductor supplier at a constant speed in a longitudinal direction parallel to the core member, wherein a first uniform sensor conductor—winding layer of sensor conductor is disposed on the core member.

There also provided a current sensor device. The current sensor device includes a plastic cable tie of the type useable to wrap around one or more current transmission members. The plastic cable tie has a longitudinal axis and a portion for latching the plastic cable tie to itself. A sensor conductor winding is wrapped around at least a portion of the plastic cable tie. Another embodiment of the current sensor provides the cable tie with notches along at least a portion thereof wherein the portion for latching is engageable with the notches to resist motion of the portion for latching relative to the cable tie with more force in one direction of the motion than the opposite direction of motion.

BRIEF DESCRIPTION OF THE DRAWINGS

FIG. 1 is a front plan view of an exemplary embodiment of a flexible current sensor having a first sensor conductor layer mounted on a core member.

FIG. 2 is a side sectional view of the flexible current sensor illustrated in FIG. 1 along a longitudinal center line.

FIG. 3 is a front plan view of an exemplary embodiment of a flexible current sensor having a first and second sensor conductor layer mounted on the core member.

FIG. 4 is a side sectional view of the flexible current sensor illustrated in FIG. 3 along a longitudinal center line.

DETAILED DESCRIPTION OF THE PREFERRED EMBODIMENTS

Figure 5:
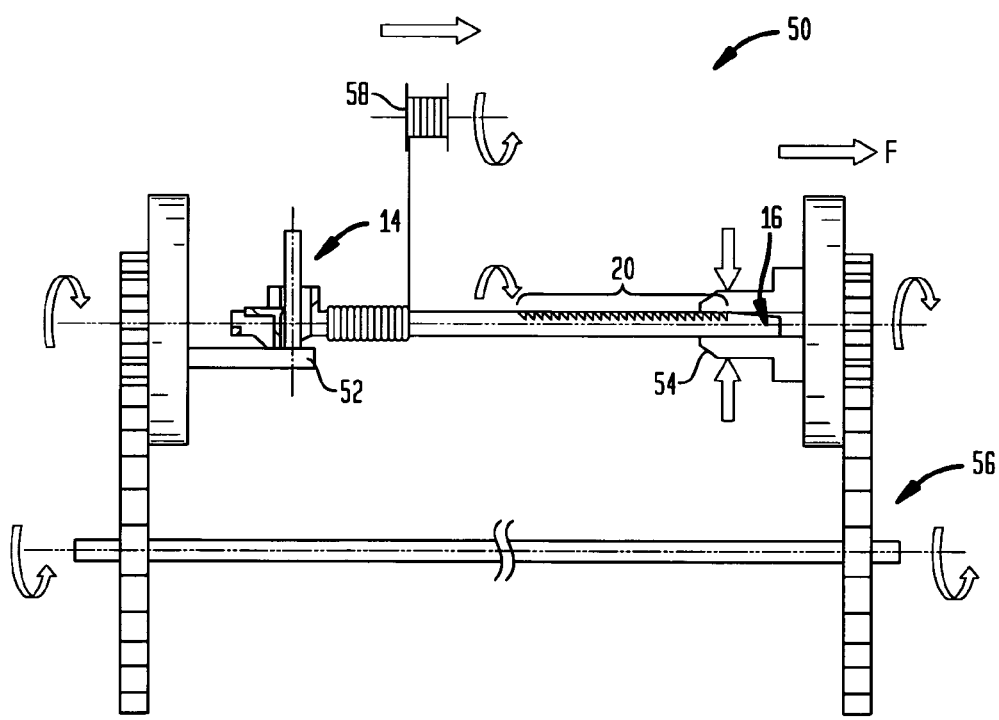
FIG. 5 is an illustration of an apparatus for making a flexible current sensor and illustrating relative motions and forces associated with the apparatus.

Referring to the figures, FIGS. 1 and 2 illustrate a flexible current sensor 10 for measuring a current in a conductor 5. The sensor 10 comprises a non-magnetic, flexible core member 12 having a first end 14 and a second end 16. The flexible core member 12 can be composed of a flexible material such as nylon, plastic, or a high modular elastomer. The flexible core member can be of any convenient length. It should be understood that the flexible core member 12 can be stored in a flat, straight manner when not looped around a conductor 5 as will be described below.

The disclosed flexible current sensor 10 has the characteristic of being able to be stored in a flat straight manner distinguishes the current sensor described from conventional current sensors that typically are rigid or if they have some flexibility do not lay in a flat straight manner. An additional characteristic of the disclosed flexible current sensor 10 is the variable diameter D of a loop formed by the current sensor as the second end 16 of the core member 12 is moved through the channel 26 in the locking head 24.

A locking head 24 is coupled to the first end 14 of the core member 12, with the locking head 24 having a channel 26 therethrough. A sensor conductor is wound in uniformly spaced turns on the flexible core member 12 forming a first sensing conductor winding layer 32. The second end 16 of the flexible core member 12 is configured to releaseably engage the locking head 24 in the channel 26.

The locking head 24 can be integral with the core member 12 as a single unit. The locking head 24 can be provided with a locking tang 28 extending into the channel 26.

A plurality of saw tooth members 18 are formed on at least a portion 20 of the core member 12 and configured to selectively engage the locking tang 28 as the second end 16 of the core member 12 is moved through the channel 26. A locking tang 28 and the locking head 24 can be composed of the same material as the flexible core member 12.

Figure 6:
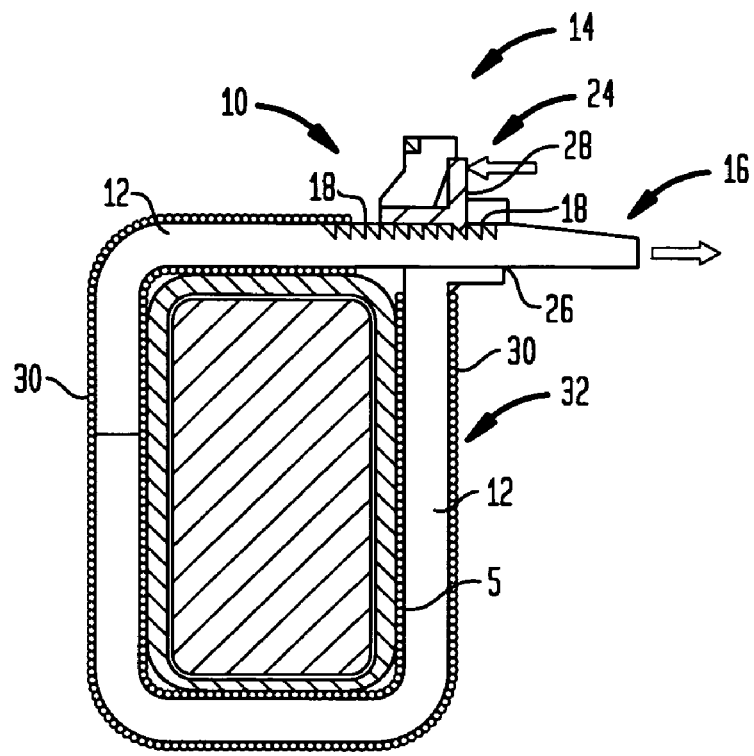
FIG. 6 is a sectional view of an exemplary embodiment of a flexible current sensor mounted on an electrical conductor with the core member configured to surround the electrical conductor having a rectangular cross section.
Figure 7:
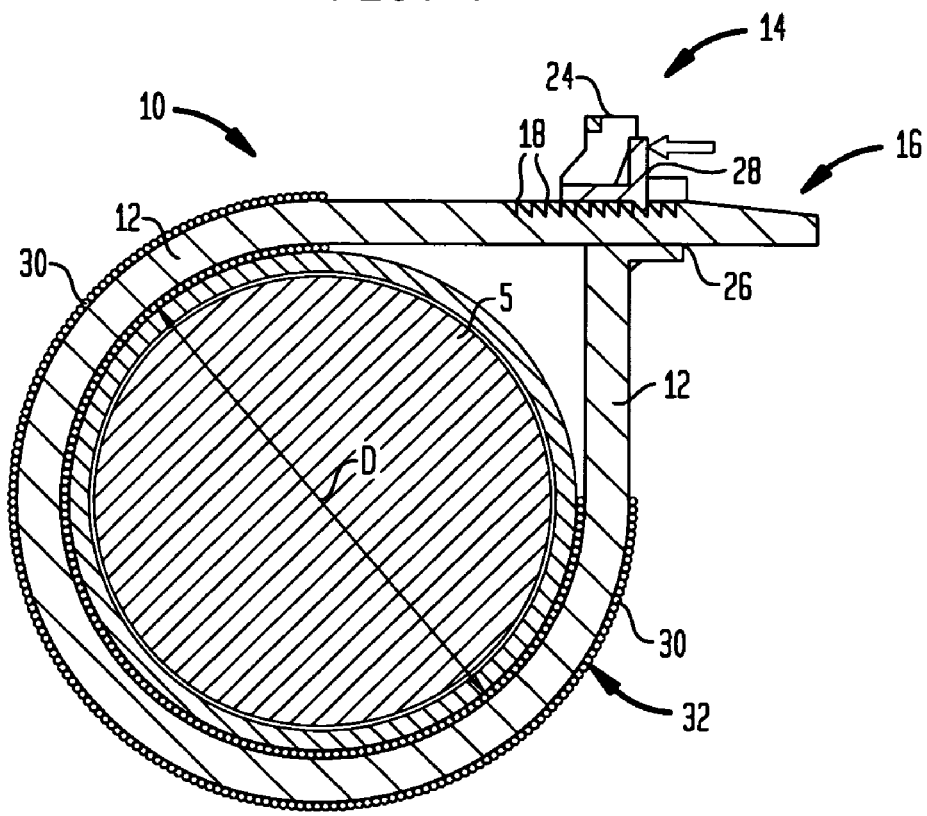
FIG. 7 is a sectional view of an exemplary embodiment of a flexible current sensor mounted on an electrical conductor having a round cross section.
Figure 8:
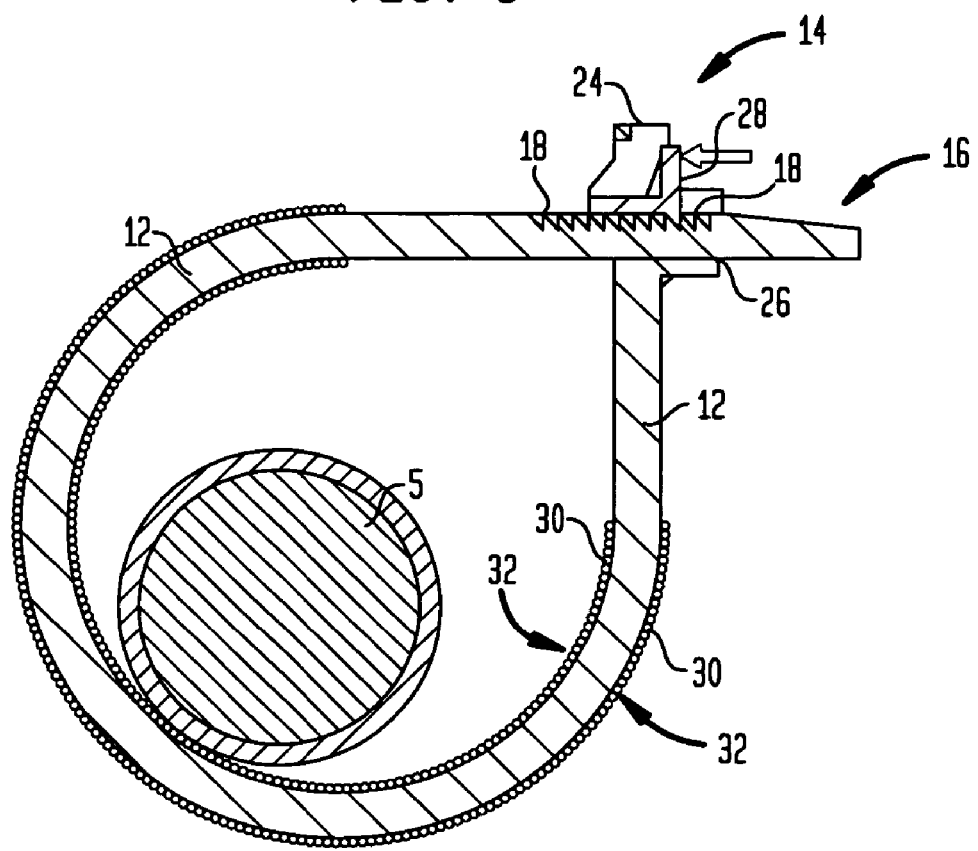
FIG. 8 is a sectional view of an exemplary embodiment of a flexible current sensor mounted on an electrical conductor having a round cross section.

In use, an operator will place the flexible current sensor 10 on the conductor 5 in a perpendicular aspect to the longitudinal length of the conductor 5 to be monitored. The second end 16 of the flexible current sensor 10 is wrapped around the conductor 5 with the second end 16 inserted into the channel 26 formed in the locking head 24. The user pulls the second end 16 through the channel 26 to draw the flexible current sensor 10 against the conductor 5. Exemplary embodiments of a flexible current sensor 10 are illustrated in FIGS. 6, 7 and 8 showing the flexible current sensor 10 wrapped around various shaped conductors 5.

With the flexible current sensor 10 wrapped in a closed loop around a conductor 5, the current sensor 10 is coupled to a signal processing circuit 40 which is configured to measure the voltage induced in the sensor conductor winding layer 32 by an electrical current passing through the monitored conductor 5.

One of the advantages of the present flexible current sensor 10 is that the current sensor 10 can be removed from the monitored conductor 5 by releasing the locking tang 28 from the saw tooth members 18 and pulling the second end 16 of the flexible core member 12 from the channel 26 in a locking head 24. The flexible current sensor 10 can then be moved to another conductor 5 for further measurements of electrical current.

The flexible current sensor 10 can be provided with additional sensor conductor winding layers 34 disposed over another sensor conductor winding layer 32 as illustrated in FIGS. 3 and 4. It should be understood that any number of sensor conductor winding layers can be disposed on the flexible core member 12 as determined by the manufacturer or user of the flexible current sensor 10.

A flexible current sensor 10 is made on an apparatus 50 (See FIG. 5). The apparatus includes a first fixture 52 and a second fixture 54 aligned coaxially with each fixture configured to engage or grip one end 14, 16 of a flexible core member 12. As illustrated in FIG. 5, the first end 14 of the flexible core member 12 is coupled to the first fixture 52 and the second end 14 is coupled to the second fixture 54. An important feature of the apparatus 50 is the ability to maintain the flexible core member straight during the winding procedure of the sensor conductor 30 onto the core member 12. A force F is applied to the second fixture 54 to maintain the core member 12 in a straight aspect during the winding process.

A sensor conductor 30 is applied to the non-magnetic, flexible core member 12 by spooling off of a sensor conductor supplier 58. The sensor conductor supplier 58 typically is a supply spool of sensor conductor 30 mounted for location in a direction opposite from the rotation direction of the core member 12 and at a predetermined speed. The sensor conductor supplier 58 also moves at a constant speed in a longitudinal direction parallel to the core member 12 wherein a first uniform sensor conductor-winding layer 32 a sensor conductor 30 is disposed on the core member 12. A second or additional sensor conductor-winding layers with sensor conductor 30 can be disposed on the core member by alternating the longitudinal direction of the sensor conductor supplier 58 as the core member 12 is rotated in the first and second fixtures 52, 54 of the apparatus 50.

The rotation of the first and second fixtures 52, 54 and the core member 12 is accomplished by a drive mechanism 56 which rotates each fixture at the same fixed predetermined speed. Synchronization of the rotation of the first and second fixtures 52, 54 can be provided by mechanical transformation, such as gear trains and may be controlled electronically with synchronized electric motors and appropriate circuitry.

Thus, there is provided a flexible current sensor for monitoring electrical current in a conductor. The foregoing description of embodiments have been presented for purposes of illustration and description. It is not intended to be exhaustive nor to be limited to the precise forms disclosed, and modifications and variations are possible in light of the above teachings or may be acquired by practice of the invention. The embodiments are chosen and described in order to explain the principles and practical applications to enable one skilled in the art to make and use the current sensor for measuring the current in a conductor and with various modifications that are suited to the particular use contemplated. It is intended that the scope of the current sensor be defined by the claims appended hereto and their equivalents.

There is also provided a current sensor device comprising a plastic cable tie of the type usable to wrap around one or more current transmission members The plastic cable tie having a longitudinal axis and a position for latching the plastic cable tie to itself. A sensor conductor winding wrapped around at least a portion of the plastic cable tie.

There is also provided the current sensor, wherein the cable tie has notches along at least a portion thereof wherein the portion for latching is engageable with the notches to resist motion of the portion for latching relative to the cable tie with more force in one direction of the motion than the opposite direction of motion.

What is claimed is:

1. A current sensor for measuring a current in a conductor, the sensor comprising:
 a non-magnetic, flexible core member having a first end and a second end;
 a locking head having a channel therethrough, with the locking head coupled to the first end of the core member, the locking head including a locking tang within the channel and a plurality of saw tooth members on a portion of the core member and configured to selectively engage the locking tang as the second end of the core member is moved through the channel; and a first sensor conductor winding layer mounted on the core member, wherein the second end releaseably engages the locking head in the channel and adjustably configures the core member to surround the conductor as the second end is moved through the channel.

2. The current sensor of claim 1, wherein the locking head is integral with the core member as a single unit.

3. The current sensor of claim 1, including at least one additional sensor conductor winding layer positioned on the first sensor conductor winding layer.

4. The current sensor of claim 1, wherein the second end of the core member is narrower then the first end of the core member.

5. The current sensor of claim 1, wherein the core member is an elongated strip of material having a rectangular cross-section.

6. The current sensor of claim 1, wherein the current sensor is configured to couple to a signal processing circuit.

7. The current sensor of claim 1, wherein a loop formed with the flexible core member is defined with a variable diameter.

8. A method to sense electrical current in a conductor using a flexible current sensor operating in accordance with the Rogowski principle, with the current sensor being an elongated, flexible strip of material having a first end and a second end, a sensor conductor winding layer mounted on the flexible strip, and a locking head including a plurality of saw tooth members and having a channel therethrough coupled to one end of the flexible strip, the method comprising the steps of:

placing the flexible current sensor on the conductor in a perpendicular aspect to the longitudinal length of the conductor;

wrapping the second end of the flexible current sensor around the conductor in a loop;

inserting the second end into the channel;

pulling the second end through the channel to draw the flexible current sensor against the conductor and engaging the saw tooth members; and sensing an induced voltage in the sensor conductor representative of the electrical current flowing in the conductor.

9. The method of claim 8, including the step of locking the second end of the flexible current sensor in the channel.

10. The method of claim 9, including the steps of unlocking the second end of the flexible sensor and removing the second end from the channel.

11. The method of claim 8, including the step of transmitting the sensed voltage to a signal processing circuit.

12. The method of claim 8, including the step of varying the diameter of the loop by moving the second end in the channel.

13. A current sensor device comprising:

a plastic cable tie of the type usable to wrap around one or more current transmission members, the plastic cable tie having a longitudinal axis and a portion for latching the plastic cable tie to itself; and a sensor conductor winding wrapped around at least a portion of the plastic cable tie.

14. The current sensor of claim 13, wherein the cable tie has notches along at least a portion thereof wherein the portion for latching is engageable with the notches to resist motion of the portion for latching relative to the cable tie with more force in one direction of the motion than the opposite direction of motion.

* * * * *